United States Patent
Kwon et al.

(10) Patent No.: US 11,569,488 B2
(45) Date of Patent: Jan. 31, 2023

(54) DISPLAY DEVICE INCLUDING LIGHT ABSORPTION LAYER AND LOW POTENTIAL ELECTRODE IN PAD REGION AND METHOD OF FABRICATING THE SAME

(71) Applicant: LG DISPLAY CO., LTD., Seoul (KR)

(72) Inventors: Oh-Sung Kwon, Paju-si (KR); Kyung-Su Lee, Paju-si (KR); Min-Jae Shin, Paju-si (KR); Sang-Jin Youn, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 16 days.

(21) Appl. No.: 17/385,142

(22) Filed: Jul. 26, 2021

(65) Prior Publication Data

US 2021/0351389 A1    Nov. 11, 2021

Related U.S. Application Data

(62) Division of application No. 16/716,337, filed on Dec. 16, 2019, now Pat. No. 11,108,030.

(30) Foreign Application Priority Data

Dec. 19, 2018 (KR) .................... 10-2018-0164956

(51) Int. Cl.
*H01L 51/40* (2006.01)
*H01L 51/56* (2006.01)
*H01L 27/32* (2006.01)

(52) U.S. Cl.
CPC .......... *H01L 51/56* (2013.01); *H01L 27/3276* (2013.01); *H01L 2251/566* (2013.01)

(58) Field of Classification Search
CPC ............................ H01L 51/56; H01L 51/40
See application file for complete search history.

(56) References Cited

U.S. PATENT DOCUMENTS

| | | | |
|---|---|---|---|
| 2007/0152220 A1* | 7/2007 | Kwack | H01L 27/124 257/E27.111 |
| 2011/0096027 A1* | 4/2011 | Jeon | G09G 3/3677 327/109 |
| 2011/0193478 A1* | 8/2011 | Kim | H05K 1/189 315/32 |
| 2012/0007107 A1* | 1/2012 | Choi | H01L 51/5259 438/26 |
| 2014/0055028 A1* | 2/2014 | Yi | H05B 33/04 313/498 |
| 2016/0209965 A1* | 7/2016 | Kim | G06F 3/0443 |
| 2017/0059906 A1* | 3/2017 | Cho | G02F 1/13394 |
| 2018/0130856 A1* | 5/2018 | Kim | H01L 27/3218 |
| 2019/0204952 A1* | 7/2019 | Han | G06F 3/0443 |

FOREIGN PATENT DOCUMENTS

KR    10-0696256 B1    3/2007

* cited by examiner

Primary Examiner — Caleb E Henry
(74) Attorney, Agent, or Firm — Polsinelli PC

(57) ABSTRACT

A display device comprises a substrate including a display region including a plurality of sub-pixels and a pad region outside the display region; a display element disposed in each of the plurality of sub-pixels; a low potential electrode formed in the pad region to apply a low potential voltage to the display element; a light absorption layer disposed on the low potential electrode in the pad region; and an encapsulation layer formed in the display region and the pad region.

7 Claims, 8 Drawing Sheets

DISPLAY DEVICE INCLUDING LIGHT ABSORPTION LAYER AND LOW POTENTIAL ELECTRODE IN PAD REGION AND METHOD OF FABRICATING THE SAME

CROSS REFERENCE TO RELATED APPLICATION

The application is a divisional of U.S. application Ser. No. 16/716,337, filed Dec. 16, 2019, which claims the priority benefit of Korean Patent Application No. 10-2018-0164956, filed on Dec. 19, 2018, of which the full disclosures of these applications are incorporated herein by reference by reference for all purposes.

BACKGROUND

Field of the Disclosure

The present disclosure relates to a display device, and more particularly, to a display device and a method of fabricating the same which can minimize an area of a bezel by cutting a pad region.

Description of the Background

Recently, with the advent of an information-oriented society, a display field for processing and displaying a large amount of information has been rapidly developed. Flat display devices, such as crystal display devices (LCDs), organic light emitting display devices, plasma display panels (PDPs), and electrophoretic display devices, having excellent performances such as light weight, thin profile, and low power consumption have recently been developed to replace conventional cathode ray tubes.

Recently, researches for minimizing a width of a bezel of a display device have been actively conducted in order to reduce overall weight and size of the display device and make an appearance of the display device beautiful by minimizing a non-display region. There are many ways to minimize the bezel, but the most efficient method is to reduce an area of a pad region at an edge of the display device.

The pad region is not a region where an actual image is displayed, but is an area where a bezel of the display device is located. Thus, reducing the pad region reduces the area of the bezel by the reduced area, so reducing the area of the pad region is the best way to reduce the area of the bezel.

However, since there is a limit in reducing the area of the pad region due to process tolerances or errors of the organic light emitting display device, there is a limit in reducing the area of the bezel.

SUMMARY

Accordingly, the present disclosure is directed to a display device and a method of fabricating the same that substantially obviate one or more of the problems due to limitations and disadvantages of the related art.

An advantage of the present disclosure is to provide a display device and a method of fabricating the same which can reduce an area of a pad region to minimize a bezel region by removing a part of the pad region after formation of components.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a substrate including a display region including a plurality of sub-pixels and a pad region outside the display region; a display element disposed in each of the plurality of sub-pixels; a low potential electrode formed in the pad region to apply a low potential voltage to the display element; a light absorption layer disposed on the low potential electrode in the pad region; and an encapsulation layer formed in the display region and the pad region.

In another aspect, a method of fabricating a display device includes: providing a substrate including a display region including a plurality of sub-pixels and a pad region outside the display region; forming a thin film transistor in the display region and forming a low potential electrode in the pad region, on the substrate; forming a light emitting element in the display region and forming a light absorption layer in the pad region, at least a part of the light absorption layer overlapping the low potential electrode; forming an encapsulation layer in the display region and the pad region; and cutting the pad region along a cutting line passing through the low potential electrode and the light absorption layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure.

In the drawings.

DETAILED DESCRIPTION

Figure 1:
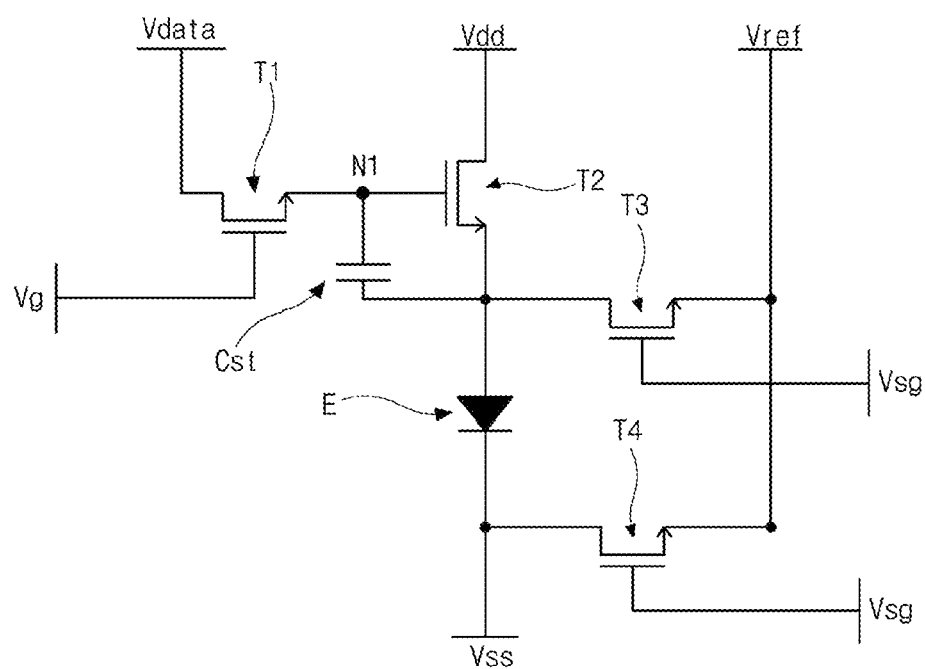
FIG. 1 is a circuit diagram of an organic light emitting display device according to an aspect of the present disclosure.

Reference will now be made in detail to example aspects, which may be illustrated in the accompanying drawings. Wherever possible, the same reference numbers will be used throughout the drawings to refer to the same or like parts. Advantages and features of the present disclosure, and implementation methods thereof will be clarified through following example aspects described with reference to the accompanying drawings. The present disclosure may, however, be embodied in different forms and should not be construed as limited to the example aspects set forth herein. Rather, these example aspects are provided so that this disclosure will be thorough and complete, and will fully convey the scope of the present disclosure to those skilled in the art.

A shape, a size, a ratio, an angle, and a number disclosed in the drawings for describing aspects of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case which is not continuous may be included unless a more limiting term, such as "just," "immediate(ly)," or "direct(ly)," is used. It will be understood that, although the terms like "first," "second," etc., may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing elements of the present disclosure, the terms like "first," and "second," may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified. The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

In the description of aspects, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and aspects of the present disclosure are not limited thereto, unless otherwise specified. Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in a co-dependent relationship.

The present disclosure provides a display device that can minimize a bezel. In particular, in the present disclosure, the bezel may be minimized by reducing an area of a pad region of the display device. In the present disclosure, the pad region may be reduced by the most intuitive and direct method of simply cutting and removing a part of the pad region after fabrication of the display device, rather than changing a structure or process of the pad region.

In particular, in the present disclosure, since only the pad region having no problem in driving the display device may be left and the other pad region may be cut and removed, the area of the pad region may be minimized and the bezel of the display device may be greatly reduced. Thus, a narrow bezel may be realized.

A cutting of the pad region of the present disclosure may be made by various methods. In this regard, the pad region may be cut by a mechanical cutting device such as a cutting wheel and an optical cutting device using a laser. Further, the pad region may be cut by using both mechanical cutting means and optical cutting means.

In particular, in the present disclosure, when cutting the pad region by the optical cutting means, in order to prevent a layer inside the display device from being damaged by a light irradiation, the light absorbing layer is provided to absorb the light to be irradiated, thereby preventing a light from being irradiated to a lower layer.

FIG. 1 is a circuit diagram of an organic light emitting display device according to an aspect of the present disclosure.

The organic light emitting display device according to an aspect of the present disclosure may include a display region and a pad region, and the display region may include a plurality of sub-pixels SPX. Each of the sub-pixels SPX may display a single color in the organic light emitting display device. For example, each sub-pixel SPX may display a corresponding one of red, green, blue, and white. In this case, red, green, blue, and white sub-pixels SPX may define (or form) one pixel. The plurality of sub-pixels SPX may be arranged in a matrix on a substrate of the organic light emitting display device, and a plurality of wirings may be disposed between the plurality of sub-pixels SPX in the display region.

Further, various wirings may be arranged in the pad region to be electrically connected to the wirings disposed in the display region and to apply signals to light emitting elements of the organic light emitting display device.

As shown in FIG. 1, each sub-pixel SPX of the organic light emitting display device according to the present disclosure may include a switching thin film transistor T1, a driving thin film transistor T2, a storage capacitor Cst, and a sensing thin film transistor T3, an auxiliary thin film transistor T4, and a light emitting element E. Since the sub-pixel SPX of the organic light emitting display device according to the present disclosure may include four thin film transistors and one capacitor, it may be referred to as a 4T1C structure. However, the structure of the sub-pixel SPX of the organic light emitting display device according to the present disclosure is not limited thereto, and the sub-pixel SPX may include various structures, such as a 2T1C structure including two thin film transistors and one capacitor, a 3T1C structure including three thin film transistors and one capacitor, a 4T2C structure including four thin film transistors and two capacitors, a 5T2C structure including five thin film transistors and two capacitors, a 6T2C structure including six thin film transistors and two capacitors, and a 7T2C structure including seven thin film transistors and two capacitors.

Each of the four thin film transistors in the sub-pixel SPX may include a semiconductor layer, a gate electrode, a source electrode, and a drain electrode, and may be a P-type thin film transistor or N-type thin film transistor. In FIG. 1, for the purpose of explanations, an N-type thin film transistor is shown by way of example.

The switching thin film transistor T1 may include a drain electrode connected to a data line, a source electrode connected to a first node N1, and a gate electrode connected to a gate line. The switching thin film transistor T1 may be turned on based on the gate voltage Vg applied from a gate driving portion to the gate line, and may charge the first node N1 with a data voltage Vdata applied from the data driving portion to the data line.

The driving thin film transistor T2 may include a drain electrode connected to a high potential line (i.e., a Vdd line), a source electrode connected to an anode of the light emitting element E, and a gate electrode connected to the first node N1. The driving thin film transistor T2 may be turned on when the voltage of the first node N1 is higher than the threshold voltage (Vth), and may be turned off when the voltage of the first node N1 is lower than the threshold voltage (Vth). The driving thin film transistor T2 may transmit a driving current received from the Vdd line to the light emitting element E.

The storage capacitor Cst may include an electrode connected to the first node N1 and an electrode connected to the source electrode of the driving thin film transistor T2. The storage capacitor Cst maintains a potential difference between the gate electrode and the source electrode of the driving thin film transistor T2 during an emission period when the light emitting element E emits a light, thereby transmitting a constant driving current to the light emitting element E.

The sensing thin film transistor T3 may include a drain electrode connected to the source electrode of the driving thin film transistor T2, a source electrode connected to a reference line, and a gate electrode connected to a sensing gate line. The sensing thin film transistor T3 may be a thin film transistor for sensing the threshold voltage of the driving thin film transistor T2.

The auxiliary thin film transistor T4 may include a drain electrode electrically connected to the cathode of the light emitting element E, a source electrode electrically connected to the reference line, and a gate electrode electrically connected to an auxiliary gate line. The auxiliary thin film transistor T4 may be turned on in the emission period and transmits a low potential voltage (i.e., a Vss voltage) to the cathode of the reference line.

Figure 2:
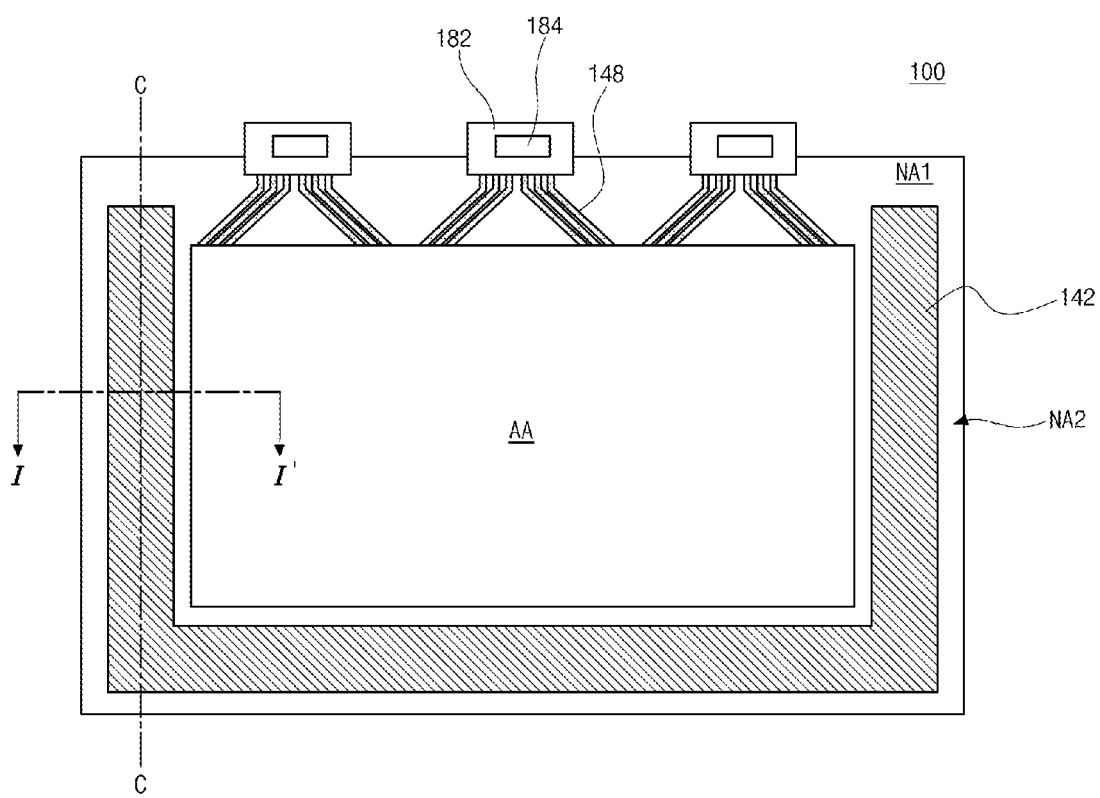
FIG. 2 is a view schematically illustrating a structure of an organic light emitting display device according to an aspect of the present disclosure.

FIG. 2 is a view schematically illustrating an actual structure of an organic light emitting display device according to an aspect of the present disclosure.

As shown in FIG. 2, the display device 100 of this aspect may include a display region AA and a pad region NA1 and NA2 formed on an outside of the display region AA.

Although not shown in the drawing, a plurality of sub-pixels SPX defined by a plurality of gate lines and a plurality of data lines may be formed in the display region AA to realize an actual image. Each sub-pixel SPX may include a driving thin film transistor, a switching thin film transistor, a sensing thin film transistor, and an auxiliary thin film transistor. Further, an image implementation portion may be formed in each sub-pixel SPX to display an actual image by an image signal input from the outside through the thin film transistors.

In a case that the display device 100 is an organic light emitting display device, the image implementation portion may include an organic light emitting layer. In a case that the display device 100 is a liquid crystal display device, the image implementation portion may include a liquid crystal layer. In a case that the display device 100 is an electrophoretic display device, the image implementation portion may include an electrophoresis. As such, the display device 100 of the present disclosure is not limited to a specific type of display device but may be applied to various display devices.

The pad region NA1 and NA2 of the display device 100 may include a first pad region NA1 formed at an upper end side of the substrate with respect to the display area AA and a second pad region NA2 formed at left and right sides and a lower end side of the substrate with respect to the display area AA.

A plurality of flexible printed circuits (FPCs) 182 may be attached to the first pad region NA1. A data driving portion 184 may be mounted on each of the FPCs 182 to input data from a timing controller (not shown). The data driving portion 184 may convert pixel data input from a timing controller into an analog data voltage using a reference gamma voltage according to a data control signal input from a timing controller (not shown). The data voltage may be supplied to the display region AA through the data line connected to the corresponding sub-pixel SPX.

Although not shown in the drawing, a plurality of pads may be formed in the first pad region NA1 so that circuit lines of the FPCs 182 are electrically connected to the pads when the FPCs 182 are attached to the display device 100.

A driving signal output from the data driving portion 184 mounted on the FPC 182 may be input through the circuit line formed at the FPC 182 and the pad formed at the first pad region NA of the display device 100 and be transmitted to the display region AA.

Further, various signal lines 148 to electrically connect the pads to the display area AA may be formed in the first pad region NA1 of the display device 100 to transmit the driving signals output from the data driving portion 184 to the display area AA. The signal lines 148 may include a Vdd line for applying a high potential voltage, a Vdata line for applying a data voltage, and a Vref line for applying a reference voltage, but is not limited thereto.

In the second pad region NA2, a low potential electrode 142 may be disposed. The low potential electrode 142 may apply a low potential voltage Vss (i.e., a cathode voltage or a common voltage) to the cathode of the light emitting element E in each sub-pixel SPX of the display region AA.

In this case, it is shown in the drawing that the low potential electrode 142 is formed with a predetermined width in a part of the second pad region NA2 around the display region AA. However, the low potential electrode 142 may be formed over the entire second pad region NA2.

The anode and the organic light emitting layer of the light emitting element E in the sub-pixel SPX of the display region AA may be formed only within the sub-pixel SPX, thus different signals may be applied to the sub-pixels SPX, thus different colors may be displayed for the sub-pixels SPX, and thus the colors displayed on these sub-pixels SPX may be combined to display an image. However, the cathode may not be formed for each sub-pixel SPX, but may be integrally formed over the entire display region AA, and thus the same low potential voltage Vss may be applied to all sub-pixels SPX in the display regon AA.

The low potential electrode 142 may be electrically connected to the cathode of the display region AA so that the low potential voltage Vss supplied from an external voltage source may be input to the cathode in the display region AA through the low potential electrode 142. Accordingly, the low potential electrode 142 may be formed over the entire second pad region NA2 so that the low potential electrode 142 may be connected to the entire outer region of the cathode to apply the low potential voltage Vss into the display region AA.

A contact electrode may be formed in the second pad region NA and be electrically connected to the low potential electrode 142 to supply the low potential voltage Vss input through the pad to the low potential electrode 142.

Although not shown in the drawing, a gate driving portion may be disposed in the second pad region NA2 on the left and right sides of the substrate, and may output a gate signal to the gate line of the display area AA according to a gate control signal from the outside.

The gate driving portion may be attached to the second pad region NA2 in a form of an IC chip (which is referred to as a Chip On Glass). Alternatively, the gate driving portion may be directly formed in the second pad region NA2 in a form of a gate in panel (GIP) circuit. The GIP circuit portion may include a shift register including a plurality of stage parts, and the stage part may include a pull-up transistor and a pull-down transistor for outputting the gate signal, and GIP lines for supplying various signals to drive the pull-up transistor and the pull-down transistor. Accordingly, the stage part may output the gate signal to the corresponding gate line in the display region AA.

The gate control signal may be input to the gate driving portion through the FPC 182 attached to the upper end side of the first pad region NA1.

The above structure of the organic light emitting display device 100 may be a structure before a part of the second pad region NA2 is removed. The organic light emitting display device 100 of the present disclosure may be completed by cutting and separating a part of the second pad region NA2 from the organic light emitting display device 100 having the above structure.

In other words, after fabricating the organic light emitting display device 100 having the above structure, a part of the left, right and lower sides of the second pad region NA2 may be cut along a cutting line C formed in the second pad region NA2 and be removed. By cutting the part of the second pad region NA2 along the cutting line C, the organic light emitting display device 100, which is finally manufactured, may include the pad region NA2 having a cutting surface (i.e., a side end surface) along the cutting line C.

The pads attached to the FPC 182 and the signal lines 148 may be formed in the first pad region NA1, while only the low potential electrode 142 to which the low potential voltage Vss is applied may be formed in the second pad region NA2. Thus, when the first pad region NA1 is cut off, the pads and the signal lines 148 may be removed and signals may not be supplied to the display region AA. Accordingly, a part of the first pad region NA1 may not be cut off and not be removed.

However, since the low potential electrode 142 is formed over the entire second pad region NA2, even when a part of the low potential electrode 142 may be removed, the second pad region NA2 may supply the low potential voltage Vss to the light emitting element E. Accordingly, a part of the second pad region NA2 may be cut and removed.

In particular, the low potential electrode 142 formed in the second pad region NA2 may serve to apply a low potential voltage to the cathode of the display region AA, and further, may extend in a long region along an outer periphery of the display region AA so that the low potential electrode 142 and the cathode may be in contact with the long region. Thus, even if a part of the second pad region NA2 is removed, problems such as a signal delay due to a decrease in contact region between the low potential electrode 142 and the cathode or a heat generation due to an increase in resistance may not happen.

As described above, the bezel area of the organic light emitting display device 100 may be reduced by cutting the second pad region NA2. In particular, since the second pad region NA2 may be cut to a maximum while being left only enough to apply the low potential voltage Vss to the cathode, the bezel area of the organic light emitting display device 100 may be reduced as much as possible.

Figure 3:
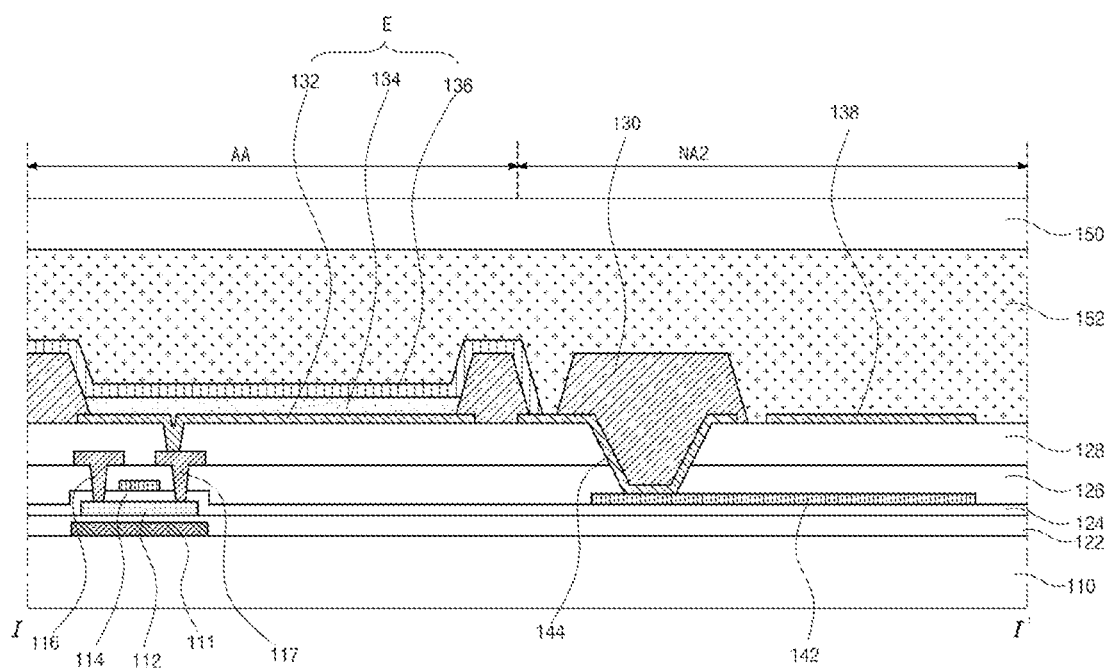
FIG. 3 is a cross-sectional view illustrating a structure of an organic light emitting display device according to an aspect of the present disclosure.

FIG. 3 is a cross-sectional view, taken along a line I-I' of FIG. 2, showing a structure of the organic light emitting display device according to an aspect of the present disclosure. The organic light emitting display device 100 according to this aspect is described in more detail with reference to FIG. 3. In FIG. 3, the organic light emitting display device is described by way of example, but the present disclosure is not limited to the organic light emitting display device, but may be applied to a liquid crystal display device, an inorganic light emitting display device (e.g., a quantum dot light emitting diode display device) or an electrophoretic display device. Further, a structure of the organic light emitting display device 100 shown in FIG. 3 is a structure before the second pad region NA2 is removed.

As shown in FIG. 3, the display device 100 according to the present disclosure may include a display region AA and a second pad region NA2 disposed outside the display region AA.

A light blocking layer 111 may be formed on a first substrate 110 of the display region AA. A buffer layer 122 may be formed entirely on the first substrate 110 having the light blocking layer 111 thereon (i.e., entirely over the display region AA and the second pad region NA2). A driving thin film transistor may be disposed on the buffer layer 122. Although not shown in the drawing, thin film transistors, such as a switching thin film transistor, a sensing thin film transistor and an auxiliary thin film transistor, may further be formed in the display region AA.

The first substrate 110 may be made of a hard transparent material such as glass, or a transparent and flexible plastic material such as polyimide, but is not limited thereto.

The light blocking layer 111 may be formed of a metal such as Cr, Mo, Ta, Cu, Ti, Al, or an alloy thereof, but is not limited thereto. The light blocking layer 111 may block a light input to the driving thin film transistor, thereby preventing an off current from being generated in the driving thin film transistor by a photoelectric effect.

The buffer layer 122 may be configured with a single layer made of an inorganic layer or a plurality of layers made of an inorganic layer and an organic layer. The inorganic layer may use an inorganic material, for example, but not limited to, $SiO_x$ or $SiN_x$, and the organic layer may use an organic material, for example, but not limited to, photoacryl.

The driving thin film transistor may be disposed in each of a plurality of sub-pixels formed in the display region AA. The driving thin film transistor may include a semiconductor layer 112 formed on the buffer layer 122, a gate insulating layer 124 formed entirely over the first substrate 110 having the semiconductor layer, a gate electrode 114 formed on the gate insulating layer 124, an interlayer insulating layer 126 formed entirely over the first substrate 110 to cover the gate electrode 114, and a source electrode 116 and a drain electrode 117 which are formed in contact with the semiconductor layer 112 through respective contact holes formed in the interlayer insulating layer 126.

The semiconductor layer 112 may be formed of a crystalline silicon or an oxide semiconductor such as indium gallium zinc oxide (IGZO). The oxide semiconductor layer may be formed to include a channel layer at a central region thereof and a doped layer at both sides thereof, and the source electrode 116 and the drain electrode 117 may contact the doped layer. Alternatively, the semiconductor layer 112 may be made of an amorphous silicon or an organic semiconductor material.

The gate electrode 114 may be formed of a single layer or a plurality of layers using at least one of metals such as Cr, Mo, Ta, Cu, Ti, Al and Al alloy. The gate insulating layer 124 may be formed of a single layer made of an inorganic material such as SiOx or SiNx, or an inorganic layer having a two-layer structure of SiOx and SiNx. In the drawing, the gate insulating layer 124 is formed over the entire first substrate 110, but may be formed only under the gate electrode 114. Further, the interlayer insulating layer 126 may be formed of a single layer or a plurality of layers using at least one of inorganic materials such as SiOx and SiNx, but is not limited thereto.

The source electrode 116 and the drain electrode 117 may be formed of Cr, Mo, Ta, Cu, Ti, Al, or Al alloy, but are not limited thereto.

Although the driving thin film transistor is described to have a specific structure in the drawings and the above description, the driving thin film transistor of the present disclosure is not limited to the described structure, but thin film transistors all known structures may be applied to the driving thin film transistor.

The passivation layer 128 may be formed entirely over the first substrate 110 having the driving thin film transistor thereon. The passivation layer 128 may be formed of a single layer made of an inorganic material and a plurality of layers made of an inorganic material and an organic material. Although not shown in the drawing, a planarization layer made of an organic material may be formed on the passivation layer 128.

An organic light emitting element E may be formed on the passivation layer 128 and be electrically connected to the drain electrode 117 of the thin film transistor through a contact hole formed in the passivation layer 128.

The organic light emitting element E may include a first electrode 132 connected to the drain electrode 117 of the thin film transistor through the contact hole, an organic light emitting layer 134 formed on the first electrode 132, and a second electrode 136 formed on the organic light emitting layer 134.

The first electrode 132 may be made of a transparent metal oxide such as indium tin oxide (ITO) or indium zinc oxide (IZO).

The second electrode 136 may be formed of a single layer or a plurality of layers made of at least one of metals such as Ca, Ba, Mg, Al, Ag and an alloy thereof. In this case, the second electrode 136 may serve as a reflective film to reflect a light emitted from the organic light emitting layer 134 in a downward direction (i.e., a direction to the first substrate 110).

Alternatively, the first electrode 132 may be formed of a single layer or a plurality of layers made of at least one of metals such as Ca, Ba, Mg, Al, Ag and an alloy thereof, and the second electrode 136 may be formed of a transparent metal oxide such as ITO or IZO.

In a case that the organic light emitting display device according to the present disclosure is a bottom emission type display device in which a light emitted from the organic light emitting layer 134 is output in a downward direction i.e., in a direction toward the first substrate 110, the first electrode 132 may be made of a transparent metal oxide and the second electrode 136 may be made of a metal or metal compound that reflects a light. In a case that the organic light emitting display device is a top emission type display device in which a light emitted from the organic light emitting layer 134 is output in a upward direction, the first electrode 132 may be made of a metal or metal compound serving as a reflective film, and the second electrode 136 is made of a transparent metal oxide.

The organic light emitting layer 134 may be an R organic light emitting layer formed in an R sub-pixel to emit a red light, a G organic light emitting layer in a G sub-pixel to emit a green light, or a B organic light emitting layer in a B sub-pixel to emit a blue light. Alternatively, the organic light emitting layer 134 may be a white organic light emitting layer formed entirely over the display device to emit a white light. In a case that the organic light emitting layer 134 is a white organic light emitting layer, R, G, B color filter layers may be respectively formed on the white organic light emitting layer of the R, G, and B sub-pixels to convert a white light emitted from the white organic light emitting layer into red light, green light, and blue light. The white organic light emitting layer may be formed by mixing a plurality of organic materials that respectively emit red light, green light and blue light, or may be formed by stacking a plurality of organic light emitting layers that respectively emit red light, green light and blue light.

Alternatively, the organic light emitting layer may be replaced by an inorganic light emitting layer formed of an inorganic light emitting material, for example, a quantum dot or the like, other than an organic light emitting material.

In addition to a light emitting material layer, the organic light emitting layer 134 may include an electron injection layer and a hole injection layer for respectively injecting electrons and holes into the light emitting material layer, and an electron transport layer and a hole transport layer for respectively transporting the injected electrons and holes to the light emitting material layer.

A bank layer 130 may be formed in a boundary region of the sub-pixel on the passivation layer 128. The bank layer 130 may serve as a partition wall so that the sub-pixels are divided by the bank layer 130 to prevent different color lights output from adjacent sub-pixels from being mixed with each other.

In the drawing, a portion of the bank layer 130 may be formed on the first electrode 132. However, the bank layer 130 may be formed only on the passivation layer 128, and the first electrode 132 may be formed to extend on a side surface of the bank layer 130. In the case that the first electrode 132 extends on the side surface of the bank layer 130, the first electrode 132 may be formed even at a corner region of a boundary between the bank layer 130 and the passivation layer 128, thus a signal may also be applied to the organic light emitting layer 134 in the corner region and a light emission may occur in the corner region, and thus an image may be realized even in such the region. Thus, a non-display region in which an image in the sub-pixel is not displayed may be minimized.

An encapsulation layer 152 may be formed on the light emitting element E and the bank layer 130. The encapsulation layer 152 may be composed of a single layer of an inorganic layer made of SiNx, SiOx or the like. Alternatively, the encapsulation layer 152 may be composed of double layers of an inorganic layer, and an organic layer made of photoacryl, polyethylene terephthalate, polyethylene naphthalate, polycarbonate, polyimide, polyethylenesulfonate, polyoxymethylene, polyarylate, or the like. Alternatively, the encapsulation layer 152 may composed of multiple layers of, for example, an inorganic layer, an organic layer and an inorganic layer.

A second substrate 150 may be attached to the encapsulation layer 152 by a transparent adhesive (not shown). As the adhesive, any material may be used as long as it has good adhesion, heat resistance and water resistance. In the present disclosure, a thermosetting resin such as an epoxy compound, an acrylate compound, an acrylic rubber or the like may be used. Alternatively, a photocurable resin may be used as the adhesive, and in this case, the adhesive may be cured by applying a light such as ultraviolet ray to the adhesive.

The second substrate 150 may be an encapsulation cap for encapsulating the organic light emitting display device. The second substrate 150 may use a protective film such as a polystyrene (PS) film, a polyethylene (PE) film, a polyethylene naphthalate (PEN) film, a polyimide (PI) film or the like.

The low potential electrode 142 may be formed on the gate insulating layer 124 of the first substrate 110 in the second pad region NA2. The low potential electrode 142 may be configured with a single-layered structure or a multiple-layered structure using at least one metals such as Cr, Mo, Ta, Cu, Ti, Al, or Al alloy, but is not limited thereto.

The low potential electrode 142 may be simultaneously formed of the same metal as the gate electrode 114 of the driving thin film transistor, but may be formed of another metal by another process. Although not shown in the drawing, the low potential electrode 142 may be electrically connected to the outside through a pad formed at an upper end of the first pad region NA1 so that a low potential voltage may be applied from the outside to the low potential electrode 142.

A connection electrode 144 may be formed on the passivation layer 128 of the second pad region NA2, and be connected to the low potential electrode 142 through a contact hole 126a formed in the interlayer insulating layer 126 and the passivation layer 128. Further, the connection electrode 144 may be connected to the second electrode 136 of the light emitting element E of the display region AA so that the low potential voltage Vss applied to the low potential electrode 142 may be transferred to the second electrode 136.

The connection electrode 144 may be made of a transparent metal oxide or an opaque metal. When the display device 100 is a bottom emission type organic light emitting display device, the connection electrode 144 may made of a transparent metal oxide such as ITO or IZO, and may be formed in the same process as the first electrode 132 of the light emitting element E. Further, when the display device 100 is a top emission type organic light emitting display device, the connection electrode 144 may be formed of a metal, and may be formed in the same process as the first electrode 132 of the light emitting element E.

In the drawing, a separate connection electrode 144 may be provided to connect the low potential electrode 142 supplied with the low potential voltage Vss to the second electrode 136 of the light emitting element E. Alternatively, without the configuration of the separate connection electrode 144, the second electrode 136 of the light emitting element E may extend into the contact hole 126a of the second pad region NA2 so that the second electrode 136 of the light emitting element E may be electrically connected directly to the low potential electrode 142.

A light absorption layer 138 may be formed on the passivation layer 128 of the second pad region NA2. The light absorption layer 138 may be formed of a material having a good absorption rate for a light of a specific wavelength. For example, the light absorption layer 138 may be formed of a metal oxide such as ITO or IZO. In this case, the light absorption layer 138 may be formed at the same time as the first electrode 132 of the light emitting element E (in a case of a bottom emission type organic light emitting display device), or may be formed at the same time as the second electrode 136 of the light emitting element E (in a case of a top emission type organic light emitting display device).

The light absorption layer 138 may be formed to overlap the low potential electrode 142. In this case, the light absorption layer 138 may be formed to completely cover the low potential electrode 142 or may overlap a part of the low potential electrode 142.

The organic light emitting display device 100 fabricated as described above may be finally completed by cutting the second pad region NA2 along the cutting line C and removing the cut part. In this case, the cutting line C may be formed along the low potential electrode 142 and the light absorption layer 138 so that a part of the low potential electrode 142 and the light absorption layer 138 may be separated and removed from the second pad region NA2 by the cutting.

As described in detail later, the second pad region NA2 of the organic light emitting display device 100 may be cut by various cutting devices. For example, the cutting device may use, but not limited to, a cutting wheel or a laser. In particular, the organic light emitting display device 100 may be cut by two different types of cutting devices because materials of components constituting the organic light emitting display device 100 may be different from each other.

For example, while an upper portion of the organic light emitting display device 100 may be configured with an encapsulation layer 152 made of an inorganic material and/or an organic material, an adhesive made of a photocurable resin and/or a thermosetting resin, and the second substrate 150 made of a polymer such as PS, PE, PEN, or PI, a lower portion of the organic light emitting display device 100 may be configured with the first substrate 110 made of glass and the low potential electrode 142 made of metal.

Accordingly, while the upper portion of the second pad region NA2 made of relatively weak materials may be cut using a relatively weak power laser such as an ultraviolet laser as a cutting device, the lower portion of relatively strong materials may be cut using a cutting wheel which is a mechanical cutting tool, or a CO2 laser of a relatively strong power.

The light absorption layer 138 may be provided to prevent a defect from occurring when the second pad region NA2 is cut by the two cutting devices, which is described in detail below.

Figure 4:
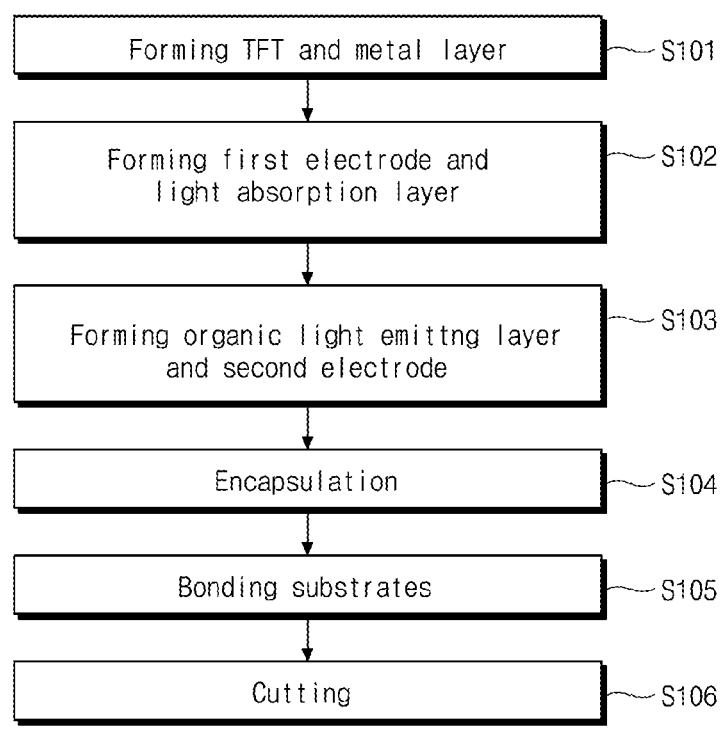
FIG. 4 is a flow chart schematically illustrating a method of fabricating an organic light emitting display device according to an aspect of the present disclosure.

FIG. 4 is a flow chart schematically illustrating a method of fabricating the organic light emitting display device according to an aspect of the present disclosure, and FIGS. 5A to 5G are cross-sectional views illustrating a method of fabricating the organic light emitting display device. The organic light emitting display device 100 according to the present disclosure may include the display region AA in which the plurality of sub-pixels SPX are arranged in a matrix and two pad regions NA1 and NA2. For convenience of explanation, in the drawings, the sub-pixel SPX located at a periphery of the display region AA and the second pad region NA2 adjacent thereto are only shown.

Figure 5A:
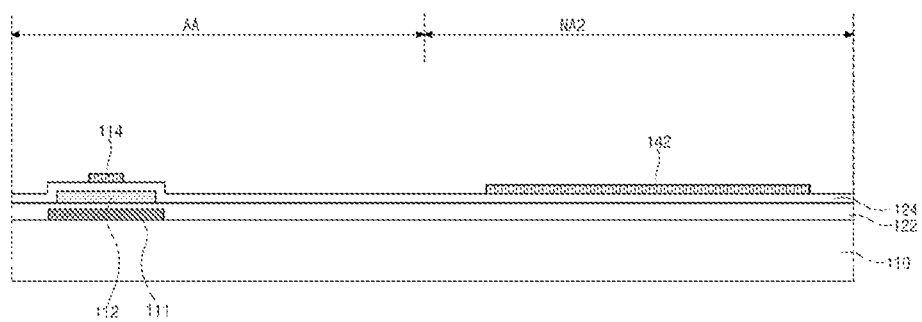
FIGS. 5A to 5G are cross-sectional views illustrating a method of fabricating an organic light emitting display device according to an aspect of the present disclosure.

As shown in FIGS. 4 and 5A, the first substrate 110 including the display region AA and the second pad region NA2 is provided, and then the light blocking layer 111 may be formed in the display region AA on the first substrate 110. The first substrate 110 may be made of a rigid transparent material such as glass, or may be made of a flexible plastic material such as polyimide.

The light blocking layer 111 may be formed by depositing Cr, Mo, Ta, Cu, Ti, Al, or an alloy thereof in a sputtering method and then etching the deposited material. For example, when using MoTi, the light blocking layer 111 may be formed to have a thickness of about 700 Å to 1300 Å.

Subsequently, the buffer layer 122 may be formed by depositing an inorganic material such as SiOx, SiNx or sequentially stacking an inorganic material and an organic material, over the entire first substrate 110 by a CVD (Chemical Vapor Deposition) method.

Thereafter, a crystalline silicon or an oxide semiconductor such as IGZO may be deposited by a CVD method and etched to form the semiconductor layer 112 in the display area AA, and then the gate insulating layer 124 may be formed by depositing an inorganic materials such as SiOx or SiNx entirely over the first substrate 110.

Subsequently, the gate electrode 114 is formed on the gate insulating layer 124 over the semiconductor layer 112 in the display region AA, and the low potential electrode 142 may be formed in the second pad region NA2. In this case, the gate electrode 114 and the low potential electrode 142 may be simultaneously formed by depositing by a sputtering method and etching Cr, Mo, Ta, Cu, Ti, Al, or an alloy thereof. Alternatively, the gate electrode 114 and the low potential electrode 142 may be formed of different metals by different processes.

Figure 5B:
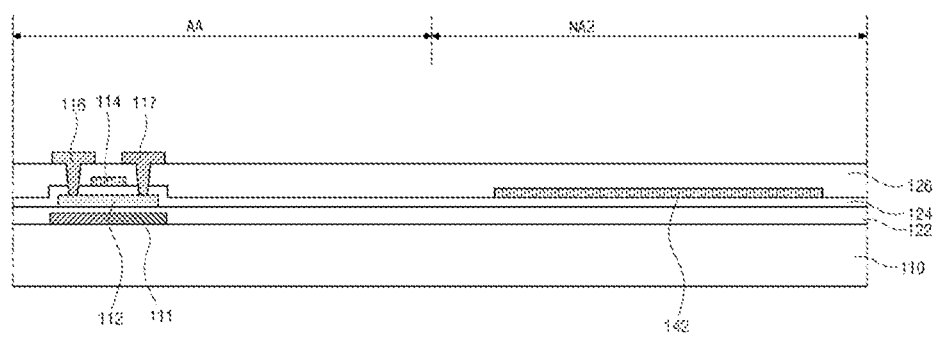

Then, as shown in FIGS. 4 and 5B, the interlayer insulating layer 126 may be formed by depositing an inorganic material, or an inorganic material and an organic material over the entire first substrate 110. Then, the source electrode 116 and the drain electrode 117 contacting the semiconductor layer 112 may be formed by depositing by a sputtering method and etching Cr, Mo, Ta, Cu, Ti, Al or an alloy thereof in the display region AA. Accordingly, a thin film transistor may be formed (S101).

Figure 5C:
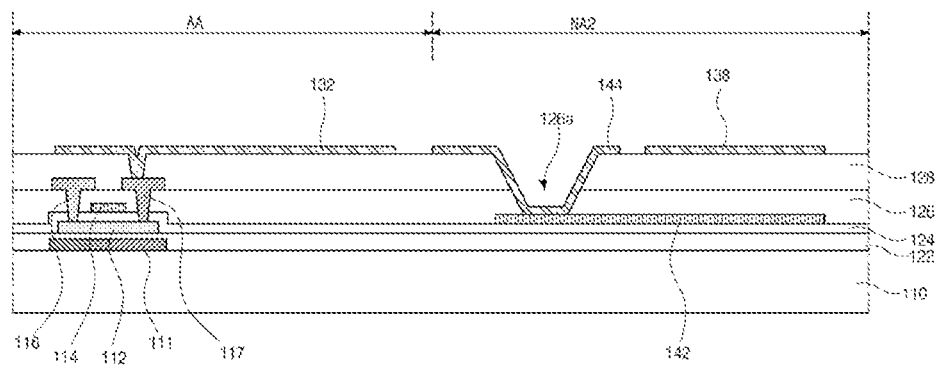

Subsequently, as shown in FIGS. 4 and 5C, the passivation layer 128 may be formed by depositing and etching an organic material, or an organic material, an inorganic material and an organic material over the entire first substrate 110. By depositing and etching a metal oxide such as ITO or IZO, the first electrode 132 connected to the drain electrode 117 of the thin film transistor may be formed in the display region AA, and the connection electrode 144 and the light absorption layer 138 may be formed in the second pad region NA2 (S102). The first electrode 132, the connection electrode 144, and the light absorption layer 138 may be formed to have a thickness of about 900 Å to 1300 Å.

As such, the first electrode 132, the connection electrode 144, and the light absorption layer 138 may be formed at the same time in the same process. Alternatively, the first electrode 132, the connection electrode 144, and the light absorption layer 138 may be formed separately in different processes. Further, the connection electrode 144 and the light absorption layer 138 may be integrally formed.

When the passivation layer 128 of the second pad region NA2 is etched, the interlayer insulating layer 126 therebelow may also be etched so that the contact hole 126a exposing a part of the low potential electrode 142 may be formed in the interlayer insulating layer 126 and the passivation layer 128, and the connection electrode 144 may extend into the contact hole 126a to be electrically connected to the low potential electrode 142.

When the first electrode 132 is formed of metal, the connection electrode 144 made of metal at the same time as the first electrode 132 may be formed in the second pad region NA2, and in this case, the light absorption layer 138 may not be formed simultaneously with the first electrode 132 and the connection electrode 144.

Figure 5D:
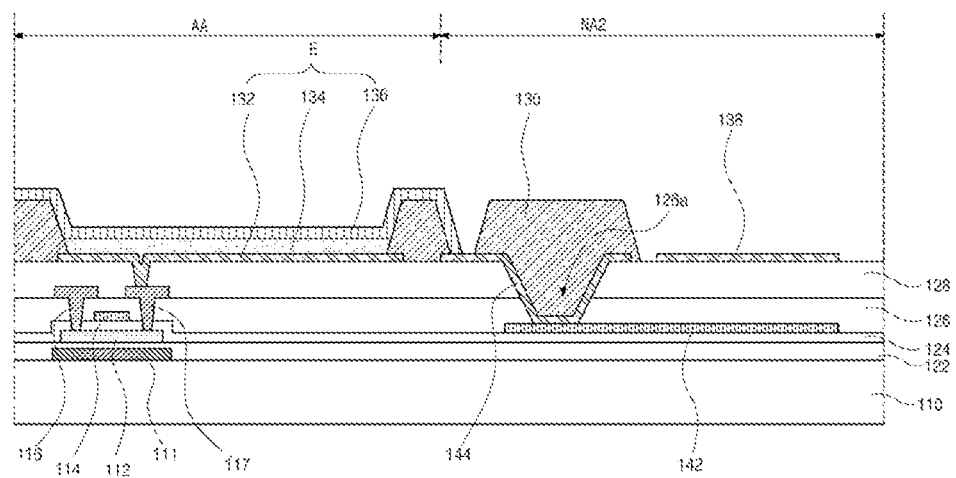

Then, as shown in FIGS. 4 and 5D, an organic material such as polyimide may be deposited and patterned on the first substrate 110 to form the bank layers 130 between the sub-pixels SPX and between the display region AA and the pad regions NA1 and NA2. Then, the organic light emitting layer 134 may be formed on the first electrode 132 between the bank layers 130 of the display region AA, and then the second electrode 136 may be formed on the organic light emitting layer 134 (S103).

The organic light emitting layers 134 may be formed by thermally depositing R, G, and B organic light emitting materials in the respective sub-pixels SPX using metal masks. Alternatively, the organic light emitting layers 134 may be formed by directly dropping R, G, B organic light emitting materials in a solution state onto the respective sub-pixels SPX.

The second electrode 136 may be formed by depositing by a sputtering method and etching Cr, Mo, Ta, Cu, Ti, Al, or an alloy thereof over the entire first substrate 110. In this case, the second electrode 136 may extend to the second pad region NA2 and be electrically connected to the connection electrode 144.

Alternatively, the second electrode 136 may be formed by depositing and etching a transparent metal oxide such as ITO or IZO. In this case, the light absorption layer 138 may be formed at the same time as the second electrode 136.

Figure 5E:
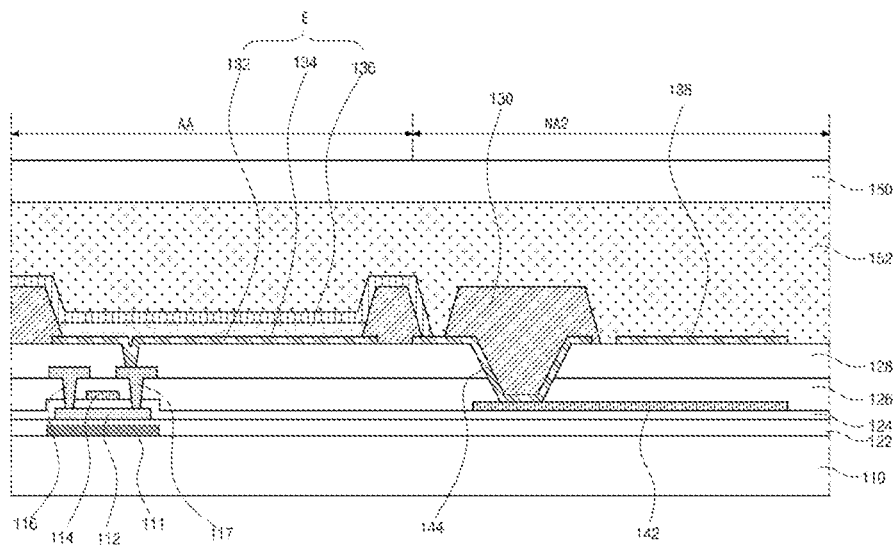

Thereafter, as shown in FIGS. 4 and 5E, the encapsulation layer 152 may be laminated over the entire first substrate 110, and then the second substrate 150 may be bonded using an adhesive (S104 and S105).

The encapsulation layer 152 may be composed of an inorganic layer, or an inorganic layer and an organic layer, or an inorganic layer, an organic layer and an inorganic layer. The inorganic layer may be made of SiNx, SiOx or the like, and the organic layer may be made of photoacryl, polyethylene terephthalate, polyethylene naphthalate, polycarbonate, polyimide, polyethylenesulfonate, polyoxymethylene, polyarylate, or the like.

Figure 5F:
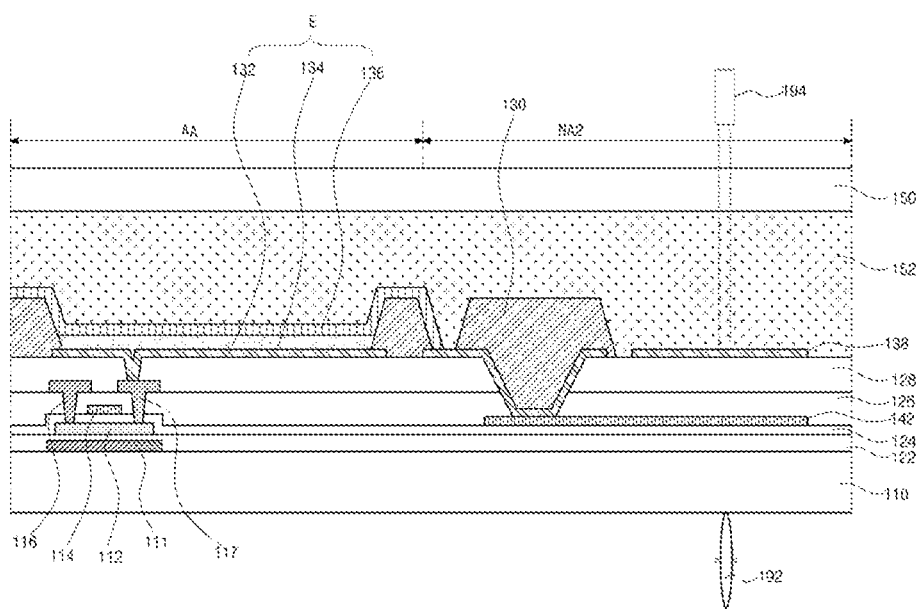
Figure 5G:
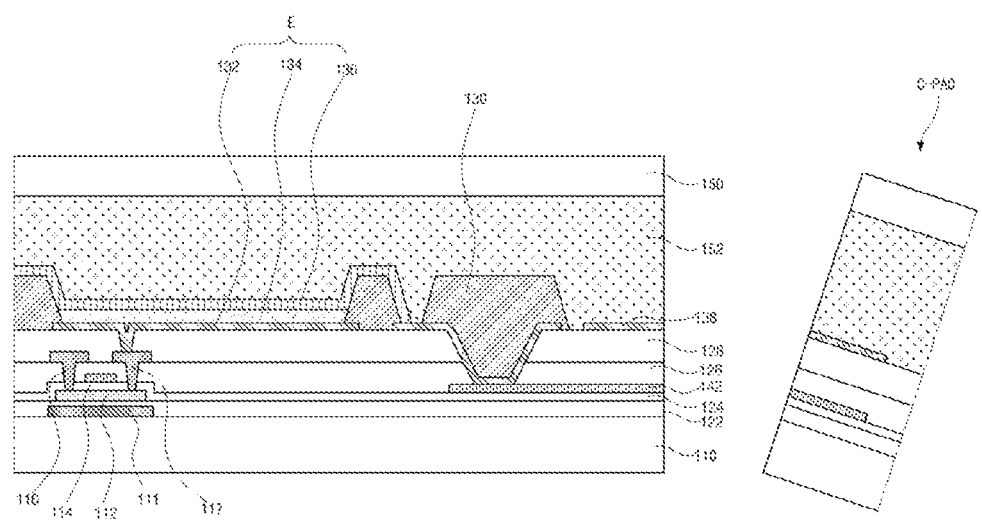

Then, as shown in FIGS. 4 and 5F, a first cutting device 192 and a second cutting device 194 may be disposed over the first substrate 110 and below the second substrate 150 of the second pad area NA2, respectively. Then, the first cutting device 192 and the second cutting device 194 may be driven to separate a cut pad region C-PAD from the display device as shown in FIG. 5G (S106). Thus, the organic light emitting display device 100 may be finally completed.

The cutting of the first substrate 110 and the second substrate 150 may proceed along the cutting line C, and the cutting line C may pass through the low potential electrode 142 and the light absorption layer 138. Thus, the first substrate 110, the second substrate 150, the buffer layer 122, the gate insulating layer 124, the interlayer insulating layer 126, the low potential electrode 142, the light absorption layer 138 and the encapsulation layer 152 may be cut along the cutting line C by the first cutting device 192 and the second cutting device 194.

Although not shown in the drawing, physical and optical energy may be directly applied to all layers of the organic light emitting display device 100 by the first cutting device 192 and the second cutting device 194 to cut the cut pad region C-PAD off. Alternatively, physical and optical energy may be transferred only to parts of the upper portion and the lower portion of the organic light emitting display device 100 by the first cutting device 192 and the second cutting device 194 to cut only the parts and form cracks along the cutting line C, then a pressure may be applied to the cutting line C or its adjacent region to propagate the cracks throughout the organic light emitting display device 100, thereby finally cutting the cut pad region C-PAD off.

The first cutting device 192 may cut the first substrate 110, the low potential electrode 142 and the like, and the second cutting device 194 may cut the second substrate 150, the encapsulation layer 152 and the like. In other words, since the first cutting device 192 may cut relatively hard glass and metal, a cutting wheel may be used as a mechanical cutting tool. However, the first cutting device 192 is not limited to the mechanical cutting device, and may use a CO2 laser of a relatively high power. Since the second cutting device 194 may cut a relatively non-hard insulating layer, a laser device such as ultraviolet laser may be used.

The first cutting device 192 and the second cutting device 194 may be disposed to face the first substrate 110 and the second substrate 150, respectively, and may be driven simultaneously to remove the second pad region NA2. Alternatively, the first cutting device 192 and the second cutting device 194 may be sequentially driven and cut.

When the second substrate 150 and the encapsulation layer 152 are cut by the ultraviolet laser of the second cutting device 194, the ultraviolet ray may be irradiated not only to the second substrate 150 and the encapsulation layer 152 but also to the passivation layer 128, the interlayer insulating layer 126 and the low potential electrode 142. In general, the inorganic material and/or the organic material forming the protective layer 128 and the interlayer insulating layer 126 may have only about 20% to 30% of an absorption rate of light in a ultraviolet wavelength band, and thus most of the irradiated light may pass through the passivation layer 128 and the interlayer insulating layer 126 as it is.

However, when the ultraviolet ray is irradiated to the low potential electrode 142 made of metal such as Cr, Mo, Ta, Cu, Ti or Al, the low potential electrode 142 may be melted and be damaged by such the melting. The region to which the ultraviolet ray is irradiated may be the exposed cutting surface of the second pad region NA2 which is the side end surface of the organic light emitting display device 100. The damage of the low potential electrode 142 may cause the defect to be exposed to the outside through the side end surface of the completed organic light emitting display device 100.

Thus, due to the defect of the side end surface, a bonding force of the organic light emitting display device 100 may be lowered so that a lifting phenomenon may occur in each layer, or cracks may be generated at the side end surface of the organic light emitting display device 100, thereby causing a damage of the organic light emitting display device 100 due to propagation of the cracks.

The light absorption layer 138 may absorb the irradiated ultraviolet ray. An ultraviolet absorption rate of a metal oxide such as ITO or IZO may be 90% or more. Thus, the ultraviolet ray emitted from the ultraviolet laser 194 and irradiated to the second pad region NA2 may be absorbed by the light absorption layer 138 and may not reach the low potential electrode 142. Thus, at the time of irradiation of the ultraviolet laser 194, the low potential electrode 142 may be prevented from being damaged, and thus lifting of layers, generation of cracks, penetration of foreign substances and the like may be prevented.

The light absorption layer 138 is not limited to the metal oxide of ITO or IZO, and may be any material as long as it absorbs an ultraviolet ray. For example, since a MoTi alloy may absorb about 90% or more of light in an ultraviolet wavelength band, the MoTi alloy may be used as the light absorption layer 138 instead of ITO or IZO.

In the case that the MoTi alloy is used as the light absorption layer 138, the first electrode 132 or the second electrode 136 may be formed of the MoTi alloy so that the light absorption layer 138 may be formed at the same time as the first electrode 132 or the second electrode 136.

The second cutting device 194 may use a laser in other wavelength band. In this case, the light absorption layer 138 may be formed of a material having a good absorption rate for light of such the wavelength band, thereby preventing a laser beam from being transmitted to the low potential electrode 142 through the light absorption layer 138.

The last organic light emitting display device 100 finally fabricated according to the present disclosure may have a structure in which the cut pad region C-PAD of FIG. 5G is separated. Accordingly, in the organic light emitting display device 100 fabricated according to the present disclosure, the light absorption layer 138 may be formed on the passivation layer 128 of the second pad region NA2, and the light absorption layer 138 may be exposed to the outside through the cutting surface i.e., the side end surface of the organic light emitting display device 100. Further, the low potential electrode 142 may also be exposed to the outside through the side end surface of the organic light emitting display device 100.

In the present disclosure, a separate encapsulation layer may be formed on the side end surface of the organic light emitting display device 100 (i.e., the side end surface of the second pad region NA2 in which the light absorption layer 138 and the low potential electrode 142 are exposed to the outside by the cutting) to encapsulate the exposed light absorption layer 138 and the low potential electrode 142 so that penetration of foreign substances such as air, moisture and the like may be prevented.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:
1. A method of fabricating a display device, comprising:
   providing a substrate including where a display region including a plurality of sub-pixels and a pad region outside the display region are defined;

forming a thin film transistor on the substrate in the display region and forming a low potential electrode on the substrate in the pad region;

forming a light emitting element in the display region and forming a light absorption layer in the pad region, at least a part of the light absorption layer overlapping the low potential electrode;

forming an encapsulation layer in the display region and the pad region; and cutting the pad region along a cutting line passing through the low potential electrode and the light absorption layer.

2. The method of claim 1, wherein the forming the thin film transistor and the low potential electrode includes:

forming a semiconductor layer on the substrate;

forming a gate insulating layer on the semiconductor layer;

forming a gate electrode on the gate insulating layer in the display region and the low potential electrode on the gate insulating layer in the pad region;

forming an interlayer insulating layer in the display region and the pad region; and forming a source electrode and a drain electrode on the interlayer insulating layer.

3. The method of claim 1, wherein the forming the light emitting element and the light absorption layer includes:

forming a passivation layer in the display region and the pad region;

forming a first electrode on the passivation layer in the display and a light absorption layer made of ITO or IZO region on the passivation layer in the pad region;

forming an organic light emitting layer on the first electrode; and forming a second electrode made of a metal on the organic light emitting layer.

4. The method of claim 1, wherein forming the light emitting element and the light absorption layer includes:

forming a passivation layer on the display region and the pad region;

forming a first electrode made of a metal in the display region on the passivation layer;

forming an organic light emitting layer on the first electrode; and forming a second electrode on the organic light emitting layer of the display region and a light absorption layer made of ITO or IZO on the passivation layer of the pad region.

5. The method of claim 1, wherein the cutting the pad region includes driving a first cutting device and a second cutting device disposed below and above the pad region, respectively.

6. The method of claim 1, wherein the first cutting device includes a cutting wheel, and the second cutting device includes a laser.

7. The method of claim 1, wherein the laser beam irradiated from the laser is absorbed by the light absorption layer.

* * * * *